(12) United States Patent
Coteus et al.

(10) Patent No.: US 7,897,878 B2
(45) Date of Patent: Mar. 1, 2011

(54) COMPLIANT PENETRATING PACKAGING INTERCONNECT

(75) Inventors: Paul Coteus, Yorktown Heights, NY (US); Gareth Geoffrey Hougham, Ossining, NY (US); Brian R. Sundlof, Verbank, NY (US)

(73) Assignee: International Business Machines Corporation, Armonk, NY (US)

( * ) Notice: Subject to any disclaimer, the term of this patent is extended or adjusted under 35 U.S.C. 154(b) by 1070 days.

(21) Appl. No.: 11/627,430

(22) Filed: Jan. 26, 2007

(65) Prior Publication Data

US 2008/0180927 A1  Jul. 31, 2008

(51) Int. Cl.
*H01R 12/04* (2006.01)
*H05K 1/11* (2006.01)
*H05K 3/36* (2006.01)

(52) U.S. Cl. .................... 174/261; 361/803; 29/830
(58) Field of Classification Search ............ 174/261, 174/267; 361/803, 773, 774, 777–779, 786, 361/791; 29/830
See application file for complete search history.

(56) References Cited

U.S. PATENT DOCUMENTS

| 6,188,028 | B1 * | 2/2001 | Haba et al. ............ 174/266 |
| 6,259,155 | B1 * | 7/2001 | Interrante et al. ....... 257/690 |
| 6,559,666 | B2 * | 5/2003 | Bernier et al. .......... 324/755 |
| 2005/0143534 | A1 * | 6/2005 | Dueber et al. .......... 525/476 |

OTHER PUBLICATIONS

"Ceramic Column Grid Array Package", Application Note, Actel, Sep. 2003, 7 pgs.
"Land grid array sockets for server applications", J.S. Corbin et al., IBM Journal of Research and Development, vol. 46, No. 6, Nov. 2002, pp. 763-778.

* cited by examiner

*Primary Examiner*—Jeremy C Norris
(74) *Attorney, Agent, or Firm*—Harrington & Smith

(57) ABSTRACT

A circuit package is provided. The circuit package includes a plurality of electrically conductive pads located on a bottom surface of the circuit package, wherein at least one pad of the plurality of bottom surface pads has a recession for receiving an electrically conductive protrusion located on a substrate to which the circuit package is to be mounted.

17 Claims, 3 Drawing Sheets

COMPLIANT PENETRATING PACKAGING INTERCONNECT

TECHNICAL FIELD

The teachings in accordance with the exemplary embodiments of this invention relate generally to an electrical interconnect and, more specifically, relate to a compliant penetrating packaging interconnect.

BACKGROUND

There are three primary types of interconnect for second level (e.g. substrate to a board), namely: ball grid array (BGA), column grid array (CGA) and land grid array (LGA). These are types of surface-mount packaging commonly used for integrated circuits.

In a BGA, balls of solder are stuck to the bottom of the package. The device is placed on a printed circuit board (PCB) that has copper pads in a pattern matching the solder balls. The assembly is then heated (e.g. in a reflow oven or by an infrared heater), causing the solder balls to melt. Surface tension causes the molten solder to hold the package in alignment with the circuit board, at the correct separation distance, while the solder cools and solidifies. The composition of the solder alloy and the soldering temperature are carefully chosen so that the solder does not completely melt, but stays semi-liquid, allowing each ball of solder to stay separate from its neighbors. Unlike with a pin grid array (PGA) interconnect (a type of interconnect that uses an array of metal pins which are inserted into holes on a PCB), a BGA has a significantly lower chance of accidentally bridging adjacent connects with solder since the solder is factory-applied to the package in exactly the right amount.

A CGA interconnect uses a high-temperature solder column instead of the high-temperature solder ball of the BGA to create a higher standoff for more flexible interconnection and to achieve an increased thermal fatigue life of the package solder joint. See "Ceramic Column Grid Array Package," Application Note, Actel, September 2003.

In comparison to a PGA, in place of pins a LGA interconnect has pads of bare gold-plated copper that touch pins on the PCB. Interconnection between mating surfaces of a module, or other area array device, and a PCB is provided through a conductive interposer. Connection is achieved by aligning the contact array of the two mating surfaces and the interposer, and mechanically compressing the interposer. See "Land grid array sockets for server applications," Corbin et al., IBM Journal of Research and Development, Vol. 46, No. 6, November 2002, pp. 763-778.

The use of each of these three technologies is generally dictated by the application. In many cases, larger substrates require migration to an LGA for reliability reasons. The reliability is often dictated by a coefficient of thermal expansion (CTE) mismatch between ceramic substrates and boards which can result in fatigue of the interconnect. For cost reasons, a BGA interconnect may be desirable. However, with the reliability concerns and the increased weight and complexity of thermal solutions, a LGA has become more and more desirable. In addition, a LGA interconnect allows for in-the-field replacement, in the event of a problem with the system.

SUMMARY

In an exemplary aspect of the invention, a circuit package is provided. The circuit package includes a plurality of electrically conductive pads located on a bottom surface of the circuit package, wherein at least one pad of the plurality of pads has a recession for receiving an electrically conductive protrusion located on a substrate to which the circuit package is to be mounted.

In another exemplary aspect of the invention, an electrical interconnect is provided. The electrical interconnect includes: a circuit package having a plurality of electrically conductive pads, wherein at least one pad of the plurality of pads includes a recession; and a substrate having at least one electrically conductive protrusion, wherein the at least one electrically conductive protrusion projects into the recession.

In a further exemplary aspect of the invention, a method for forming an electrical interconnect is provided. The method includes the steps of: providing a circuit package having a plurality of electrically conductive pads; creating a recession in at least one pad of the plurality of pads; and attaching the circuit package to a substrate having at least one electrically conductive protrusion, wherein the at least one electrically conductive protrusion projects into the recession to form an electrical connection between the circuit package and the substrate.

BRIEF DESCRIPTION OF THE DRAWINGS

The foregoing and other aspects of embodiments of this invention are made more evident in the following Detailed Description, when read in conjunction with the attached Drawing Figures, wherein.

DETAILED DESCRIPTION

The drawback to present LGA connectors lies in the inherent need for large loads to be applied to the substrate and board to ensure good connectivity. This invention provides a lower-cost solution with lower attach loads that generates a high reliability interconnect.

Current LGA structures on packages comprise a pad covering single or multiple vias (e.g. contact holes). The invention utilizes a recessed pad, via or plug, as non-limiting examples, on the package in conjunction with a deformable stud on the board. One advantage of this plug and stud method is that it provides a high surface area for interconnection, even with lower loads. In addition, the reliability of the interconnect is higher. A compliant layer (a layer of suitable material intended to reduce the strains of thermal expansion on the package) on one or both of the package and board will cushion the CTE mismatch and any warpage/camber mismatch between the board and substrate.

The invention can involve using a polymer mask on the bottom surface metallurgy (BSM; a metallization pad electrically connected to internal conductors within a multilayered ceramic package, to which pins may be brazed, for example) of the package. The polymer should preferably be able to withstand multiple high-temperature reflows (e.g. about 220-270 deg. Celsius). One non-limiting example of such a polymer is photosensitive siloxane. The polymer mask can be a photosensitive polymer that can be spun on the BSM or a decal with holes previously "drilled," as non-limiting examples. If a photosensitive polymer is employed, the open holes can be exposed to the BSM pads. If a decal is utilized, the holes can be aligned with the BSM pads. The pads are then etched or ablated (e.g. mechanically, by a laser) to a controlled depth. The recess or plug can then be used as is or plated with non-oxidizing metal (e.g. nickel, nickel-phosphorous, nickel-boron, gold, rhodium, ruthenium). The studs can be formed by a traditional plating technique in the board manufacturing, ball drop, solder transfer, screening or applied as decal. One of ordinary skill in the art will appreciate the plating techniques available as well as the particulars thereof. At this stage, the substrate and board can be attached using similar LGA clamping hardware.

Figure 3:
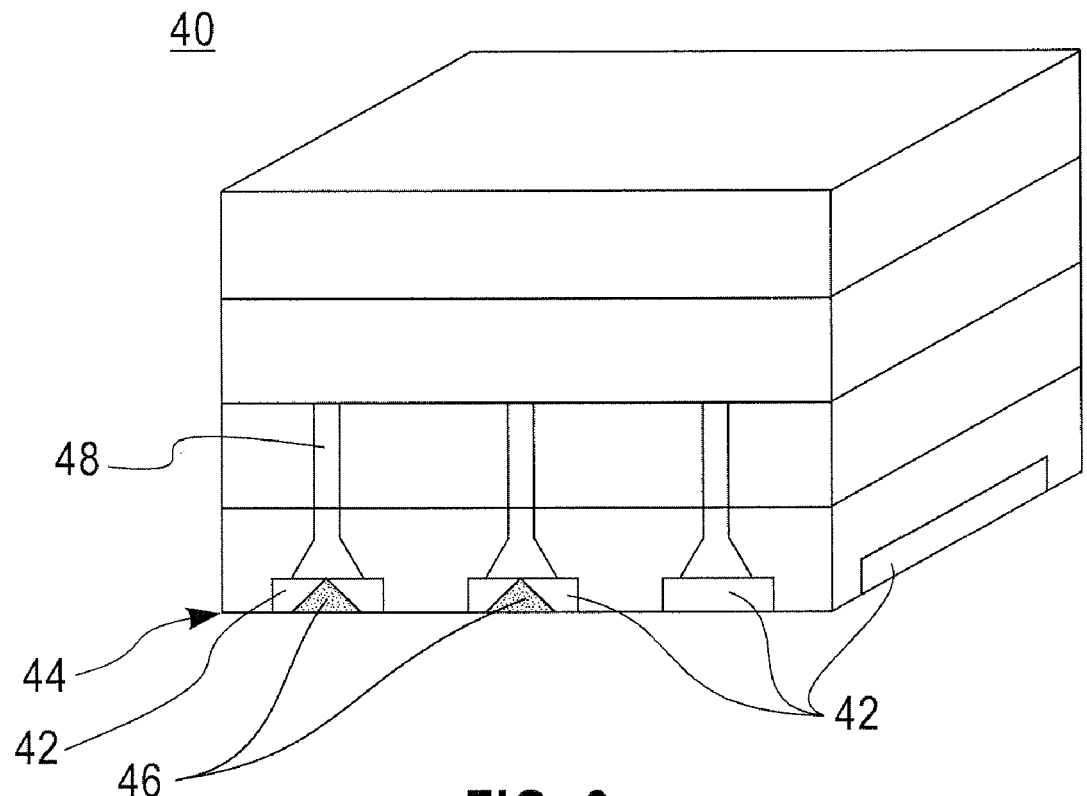
FIG. 3 shows an exemplary circuit package incorporating features of the invention.

Referring first to FIG. 3, there is shown an exemplary circuit package 40 incorporating features of the invention. The circuit package 40 comprises a plurality of electrically conductive pads 42 located on a bottom surface 44 of the circuit package 40. At least one of the pads 42 has a recession. In the exemplary circuit package 40 of FIG. 3, there are two recessions 46 in two separate pads. The recessions 46 are each adapted to receive one electrically conductive protrusion located on a mating substrate, a different protrusion for each recession.

The circuit package 40 may comprise a multi-layer circuit package. The circuit package 40 may comprise internal metallization and component layers with vias. The circuit package 40 may comprise at least one via 48 extending downwards to the bottom surface 44 of the circuit package 40, wherein the at least one via 48 connects to an electrically conductive pad. The plurality of electrically conductive pads comprise an electrical material, such as a metal, as a non-limiting example.

Figure 1:
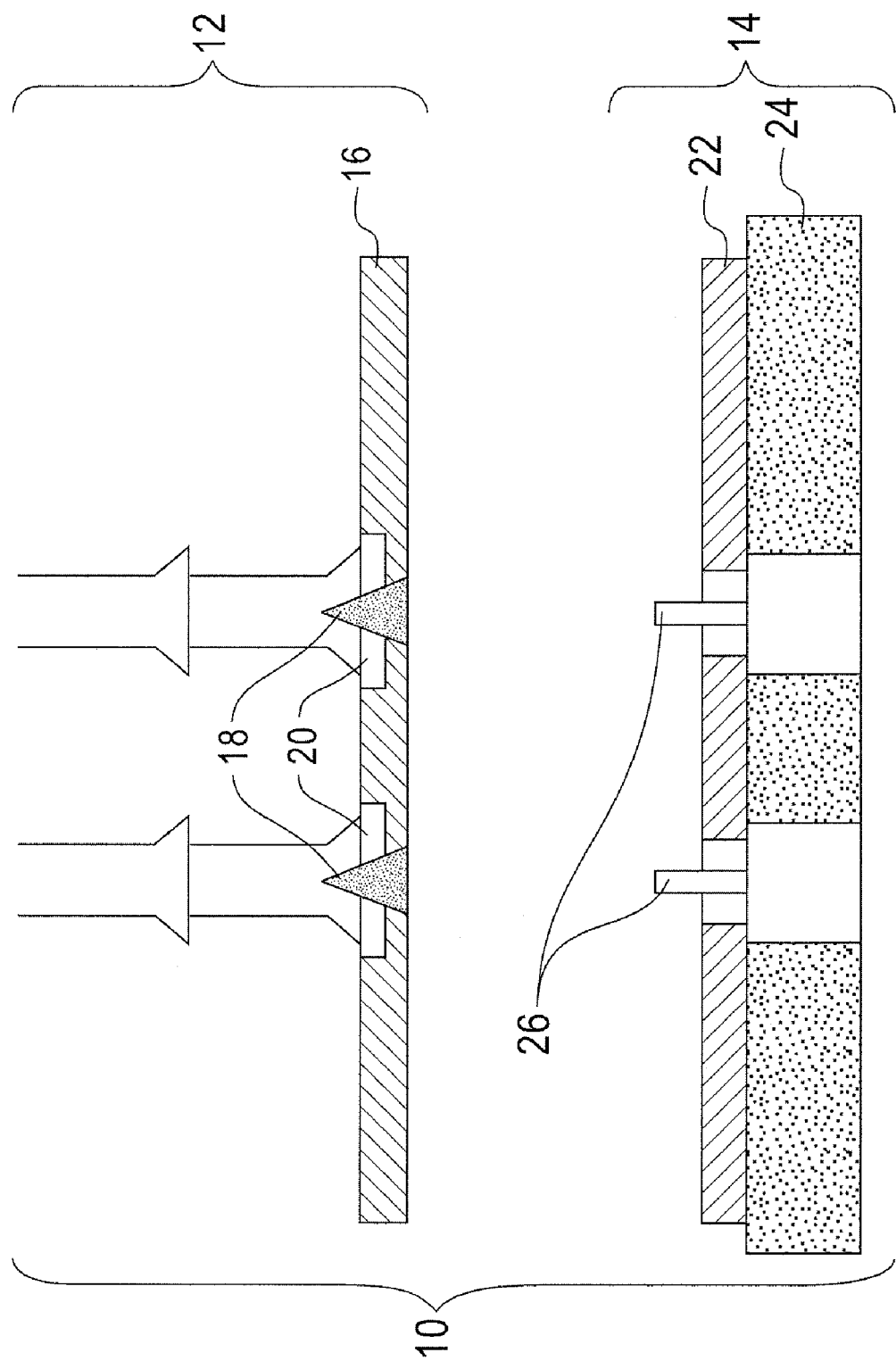
FIG. 1 shows a cross sectional diagram of two exemplary pre-assembly structure layers incorporating features of the invention.

Referring to FIG. 1, there is shown a cross sectional diagram of two exemplary pre-assembly structure layers 10 incorporating features of the invention. Although the invention will be described with reference to the exemplary embodiments shown in the drawings, it should be understood that the invention can be embodied in many alternate forms of embodiments. In addition, any suitable size, shape or type of elements or materials could be used.

As shown in FIG. 1, the pre-assembly layers 10 comprise an upper portion (e.g. package, substrate) 12 and a lower portion (e.g. board) 14. The upper portion 12 comprises a polymer mask layer 16 having recessions 18 and BSM pads 20. As noted above, the polymer mask 16 may comprise a photosensitive polymer, such as photosensitive siloxane, as a non-limiting example. As further noted above, the recessions 16 may comprise holes, plugs or vias, as non-limiting examples. The lower portion 14 comprises a compliant layer 22 placed upon a PCB 24 with interconnect studs 26 connected to the PCB 24 projecting through and above the compliant layer 22. The interconnect studs 26 facilitate a connection between the lower portion 14 and the upper portion 12 by connecting with the recessions 18.

Figure 2:
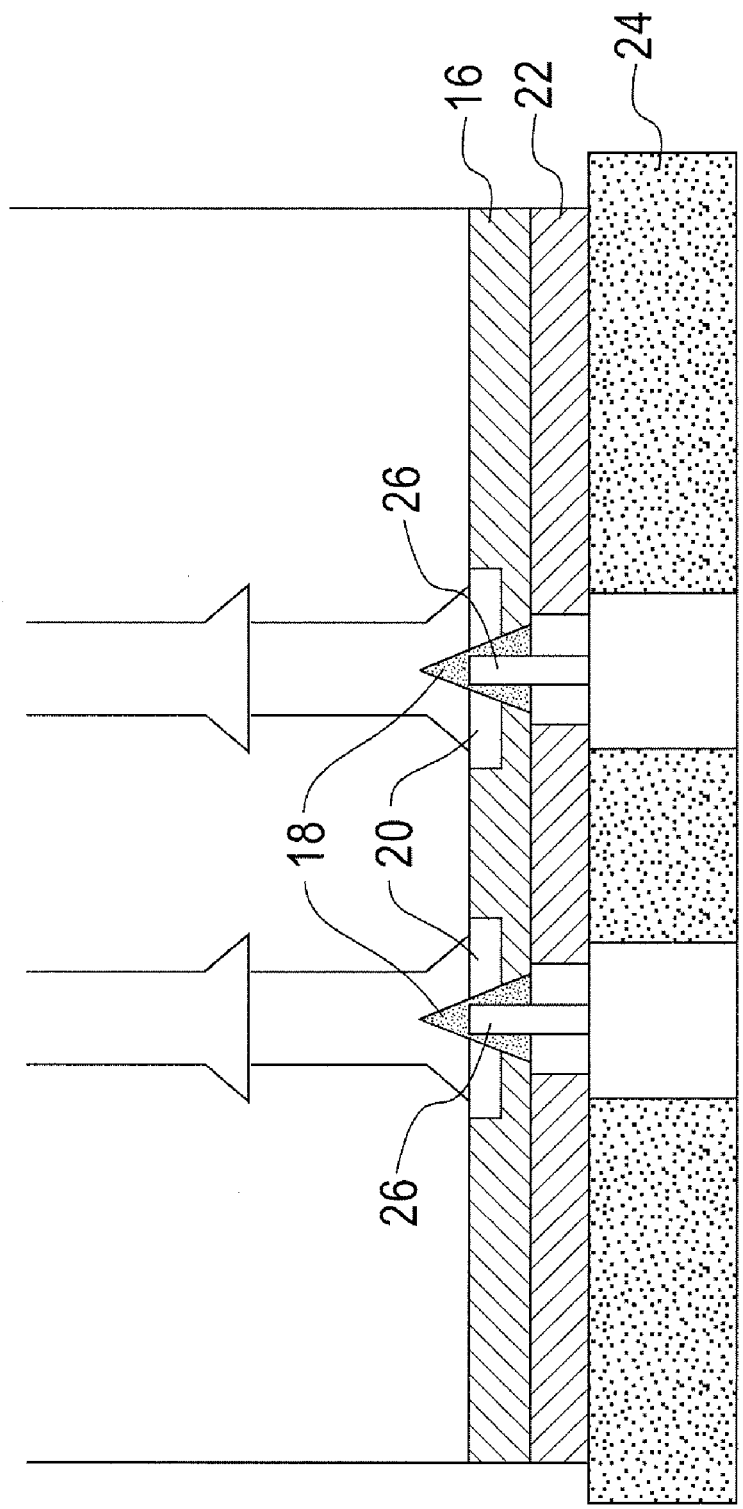
FIG. 2 shows a cross sectional diagram of an exemplary assembled structure incorporating features of the invention.

Referring also to FIG. 2, there is shown a cross sectional diagram of an exemplary assembled structure 32 incorporating features of the invention. In the assembled structure 32 of FIG. 2, the upper portion 12 and lower portion 14 have been connected using conventional assembly techniques (e.g. conventional LGA assembly techniques). The interconnect studs 26 of the lower portion 14 project into the recessions 18 of the upper portion 12 to connect with the BSM pads 20. Thus, a reliable connection between the package 12 and board 14 is obtained.

Although shown in FIGS. 1 and 2 with a compliant layer 22 and a polymer mask layer 16, a compliant layer may be located on one or both of the upper portion 12 and lower portion 14 (e.g. only the polymer mask layer 16, only the compliant layer 22, both the polymer mask layer 16 and the compliant layer 22). In addition, although shown in FIG. 2 with the polymer mask 16 remaining as a component of the assembled structure 32, in other embodiments the polymer mask 16 may not be included in the assembled structure. As a non-limiting example, prior to assembly the polymer mask may be removed from the upper portion.

As an added degree of reliability, and to ensure low force interconnects, the interconnect studs can be made of, or coated with, a low-temperature solder. A mechano means or thermal means of flowing the solder once connected would provide additional contact and rigidity. The compliant layer (s) addresses concerns with CTE mismatch.

Since some permanent compliance is often desired to ensure positive electrical contact, the studs could be fabricated using contact types more typically utilized in LGAs. As one non-limiting example, compliant metal-in-polymer filled siloxane contacts could be inexpensively injection molded directly into place on the board. As other non-limiting examples, angled metal cantilevers or fuzz buttons could be soldered into place.

Figure 4:
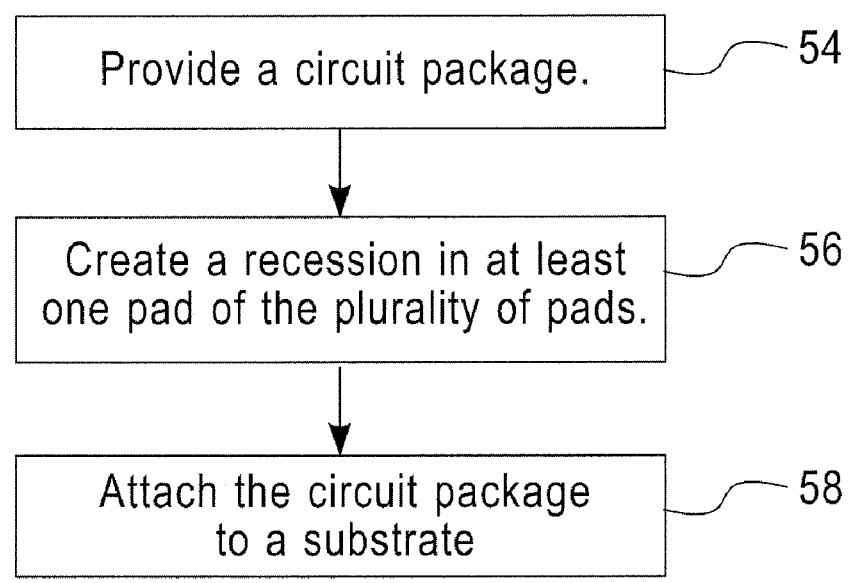
FIG. 4 depicts a flowchart illustrating one non-limiting example of a method for practicing the exemplary embodiments of this invention.

FIG. 4 depicts a flowchart illustrating one non-limiting example of a method for practicing the exemplary embodiments of this invention. The method includes the following steps. In box 54, a circuit package is provided. The circuit package comprises a plurality of electrically conductive pads located on a bottom surface of the circuit package. In box 56, a recession is created in at least one pad of the plurality of pads. In box 58, the circuit package is attached to a substrate. The substrate comprises at least one electrically conductive protrusion. The at least one electrically conductive protrusion projects into the recession to form an electrical connection between the circuit package and the substrate.

In another embodiment, there may be an intermediate step of attaching a compliant layer to the circuit package. In a further embodiment, there may be an intermediate step of attaching a compliant layer to the substrate. In another embodiment, there may be an intermediate step of attaching a decal to the circuit package. In a further embodiment, there maybe an intermediate step of attaching a decal to the substrate. The creation of the recession may be accomplished by etching or ablating the at least one pad of the plurality of pads using an etching process or an ablation process. If a compliant layer or decal is attached to the circuit package, the creation of the recession in at least one pad of the plurality of pads may necessitate creating the recession through the compliant layer or decal. As a non-limiting example, if a photosensitive polymer mask is attached to the circuit package, the recession may be created by first creating apertures in the polymer mask and subsequently etching the at least one pad of the plurality of pads.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention.

Furthermore, some of the features of the preferred embodiments of this invention could be used to advantage without the corresponding use of other features. As such, the foregoing description should be considered as merely illustrative of the principles of the invention, and not in limitation thereof.

What is claimed is:

1. A circuit package comprising a plurality of electrically conductive pads located on a bottom surface of the circuit package, wherein at least one pad of the plurality of pads comprises a recession for receiving an electrically conductive protrusion located on a substrate to which the circuit package is to be mounted, wherein the recession is plated with a non-oxidizing metal that comprises one of nickel, nickel-phosphorous or nickel-boron.

2. The circuit package of claim 1, further comprising at least one compliant layer located between the circuit package and the substrate.

3. The circuit package of claim 2, wherein the at least one compliant layer comprises a polymer.

4. The circuit package of claim 2, wherein the at least one compliant layer comprises siloxane.

5. The circuit package of claim 2, wherein the at least one compliant layer comprises a photosensitive polymer spun on the bottom surface of the circuit package.

6. The circuit package of claim 2, wherein the at least one compliant layer comprises a decal having at least one aperture disposed to align with a pad of the plurality of pads.

7. The circuit package of claim 1, wherein the electrical connection between the circuit package and the substrate comprises a land grid array interconnect and wherein the electrically conductive protrusion on the substrate comprises a predetermined size and shape to form a secure electrical connection with the recession of the at least one pad.

8. An electrical interconnect comprising:
a circuit package comprising a plurality of electrically conductive pads, wherein at least one pad of the plurality of pads comprises a recession; and
a substrate comprising at least one electrically conductive protrusion, wherein the at least one electrically conductive protrusion projects into the recession, wherein the at least one electrically conductive protrusion comprises a compliant metal-in-polymer filled siloxane contact that is injection molded into place on the substrate.

9. The electrical interconnect of claim 8, wherein the at least one electrically conductive protrusion comprises a low-temperature solder.

10. The electrical interconnect of claim 8, wherein the at least one electrically conductive protrusion is coated with a low-temperature solder.

11. The electrical interconnect of claim 8, wherein the at least one electrically conductive protrusion comprises an angled metal cantilever.

12. The electrical interconnect of claim 8, wherein the at least one electrically conductive protrusion comprises a fuzz button.

13. A method for forming an electrical interconnect comprising:
providing a circuit package having a plurality of electrically conductive pads located on a bottom surface of the circuit package;
creating a recession in at least one pad of the plurality of pads; and
attaching the circuit package to a substrate having at least one electrically conductive protrusion, wherein the at least one electrically conductive protrusion projects into the recession to form an electrical connection between the circuit package and the substrate, wherein the at least one electrically conductive protrusion comprises a compliant metal-in-polymer filled siloxane contact that is injection molded into place on the substrate.

14. The method of claim 13, wherein creating the recession comprises attaching a compliant layer to the bottom surface of the circuit package.

15. The method of claim 13, wherein creating the recession comprises an etching process.

16. The method of claim 13, wherein creating the recession comprises an ablation process.

17. The method of claim 13, further comprising attaching a decal to the bottom surface of the circuit package, wherein the decal comprises at least one aperture disposed to align with a pad of the plurality of pads.

* * * * *